US007272769B1

(12) United States Patent
Botha (10) Patent No.: US 7,272,769 B1
(45) Date of Patent: Sep. 18, 2007

(54) SYSTEM AND METHOD FOR INTERLEAVING DATA IN A WIRELESS TRANSMITTER

(75) Inventor: Louis Jacobus Botha, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1303 days.

(21) Appl. No.: 09/873,310

(22) Filed: Jun. 5, 2001

(51) Int. Cl.
  *H03M 13/00* (2006.01)
(52) U.S. Cl. .................. 714/752; 714/702; 714/786
(58) Field of Classification Search ................ 714/702, 714/752, 776
  See application file for complete search history.

(56) References Cited

U.S. PATENT DOCUMENTS

| 5,717,686 | A | 2/1998 | Schiavoni |
| 5,825,807 | A | 10/1998 | Kumar |
| 5,923,679 | A | 7/1999 | Itoh et al. |
| 5,946,357 | A | 8/1999 | Sandin et al. |
| 6,154,513 | A | 11/2000 | Tachibana et al. |
| 6,185,200 | B1 | 2/2001 | Prasad |
| 6,564,343 | B1 | 5/2003 | Yamashita |
| 6,598,198 | B1 | 7/2003 | Furuta et al. |
| 6,675,016 | B2 * | 1/2004 | Lucidarme et al. ...... 455/452.2 |
| 6,768,903 | B2 * | 7/2004 | Fauconnier et al. ......... 455/403 |
| 7,012,911 | B2 * | 3/2006 | Kasturi et al. .............. 370/342 |

OTHER PUBLICATIONS

PCT Notification of Transmittal of the International Search Report or the Declaration and International Search Report, Date of Mailing Oct. 2, 2002 (4 pages).

* cited by examiner

*Primary Examiner*—Guy Lamarre
*Assistant Examiner*—Esaw T. Abraham
(74) *Attorney, Agent, or Firm*—McAndrews, Held & Malloy, Ltd.

(57) ABSTRACT

A system and method for interleaving data in a wireless transmitter wherein bits from the input data stream are sent to downstream processing without being stored in memory. According to a first example embodiment of the present invention, a first radio frame of data from an input code block is sent downstream, and the remaining radio frames from the code block are stored in the memory buffer. The first interleaving pattern can be applied, for example, as data is written to or read from the memory buffer. The stored radio frames are then read out as needed by the downstream processing. According to a second example embodiment of the present invention, further savings in memory can be achieved by discarding bits that are not currently needed for processing then recalculating them at a later time. A first radio frame of data from an input code block is sent downstream without being stored in the memory buffer. Additional radio frames from the input code block may be stored in the memory buffer, and the remaining frames are discarded. Those radio frames stored in the memory buffer are then read out as needed by downstream processing. The input code block is then recalculated by the operations upstream from the first interleaver, and the sending downstream, storing, and discarding operations are repeated until the remaining radio frames have been provided to downstream processing.

16 Claims, 10 Drawing Sheets

|  | COL 1 | COL 2 | ... | COL C |
|---|---|---|---|---|
| ROW 1 | $X_1$ | $X_2$ | ... | $X_C$ |
| ROW 2 | $X_{(C+1)}$ | $X_{(C+2)}$ | ... | $X_{(2C)}$ |
| ⋮ | ⋮ | ⋮ | ... | ⋮ |
| ROW R | $X_{((R-1)C+1)}$ | $X_{((R-1)C+2)}$ | ... | $X_{(RC)}$ |

|  | COL 1 | COL 2 | ... | COL C |
|---|---|---|---|---|
| ROW 1 | $Y_1$ | $Y_{(R+1)}$ | ... | $Y_{((C-1)R+1)}$ |
| ROW 2 | $Y_2$ | $Y_{(R+2)}$ | ... | $Y_{((C-1)R+2)}$ |
| ⋮ | ⋮ | ⋮ | ... | ⋮ |
| ROW R | $Y_R$ | $Y_{(2R)}$ | ... | $Y_{(RC)}$ |

SYSTEM AND METHOD FOR INTERLEAVING DATA IN A WIRELESS TRANSMITTER

CROSS-REFERENCE TO RELATED APPLICATIONS

This application is related to co-pending U.S. patent application Ser. No. 09/873,316, entitled "System and Method for De-Interleaving Data in a Wireless Receiver," filed concurrently herewith, which is hereby incorporated in its entirety.

BACKGROUND

1. Field of the Invention

The present invention relates generally to wireless communications and more particularly to a system and method for interleaving data in a wireless transmitter.

2. Discussion of the Related Art

The Third Generation Partnership Project (3GPP) represents the joint effort of various standards setting bodies to produce globally applicable technical specifications and technical reports for the Universal Mobile Telecommunications System (UMTS). The UMTS is based on evolved Global System for Mobile Communications (GSM) core networks and the radio access technologies that they support (i.e., Universal Terrestrial Radio Access Network (UTRAN) including both Frequency Division Duplex (FDD) and Time Division Duplex (TDD) modes).

The 3GPP UTRAN FDD transmitter chain includes two interleavers. The first interleaver takes an input data stream divided into code blocks, interleaves the data, and outputs the interleaved data as radio frames. Conventional transmitter designs employ a memory buffer to store the input data stream while the interleaving is performed. The memory buffer is sized to accommodate the maximum number of data bits allowed by the 3GPP specification. This memory buffer and its associated read/write logic require an amount of chip real estate and power that can be significant in terms of the transmitter design. This is particularly true where chip real estate and power usage are at a premium, such as in the design of wireless handsets.

What is needed is an improved system and method for interleaving data in a wireless transmitter wherein a savings in memory is achieved.

SUMMARY OF THE INVENTION

The present invention addresses these concerns by providing a system and method for interleaving data in a wireless transmitter wherein bits from the input data stream are sent to a downstream process without being stored in memory. According to a first example embodiment of the present invention, a first radio frame of data from an input code block is sent downstream, and the remaining radio frames from the code block are stored in the memory buffer. The first interleaving pattern can be applied, for example, as data is written to or read from the memory buffer. The stored radio frames are then read out as needed by the downstream processing. According to this example embodiment, the memory buffer can be decreased in size because the first radio frame of data need not be stored.

According to a second example embodiment of the present invention, further savings in memory can be achieved by discarding bits that are not currently needed for processing and then recalculating them at a later time. A first radio frame of data from an input code block is sent downstream without being stored in the memory buffer. Additional radio frames from the input code block may be stored in the memory buffer, and the remaining frames are discarded. Those radio frames stored in the memory buffer are then read out as needed by downstream processing. The input code block is then recalculated by the operations upstream from the first interleaver, and the sending downstream, storing, and discarding operations are repeated until the remaining radio frames have been provided to downstream processing.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

The present invention provides a system and method for interleaving data in a wireless transmitter. The first interleaver in a 3GPP UTRAN transmitter is adapted according to the present invention to conserve memory. According to a first example embodiment of the present invention, the first interleaver sends the first radio frame within each code block to downstream processing, rather than storing the frame in the first interleaver memory buffer. This reduces the required size of the memory buffer by an amount equal to the radio frame size. According to a second example embodiment of the present invention, further savings in memory are realized by discarding bits that are not immediately required for processing and recalculating the discarded bits at a later time. These and other example embodiments of the present invention are described in greater detail below.

Figure 1:
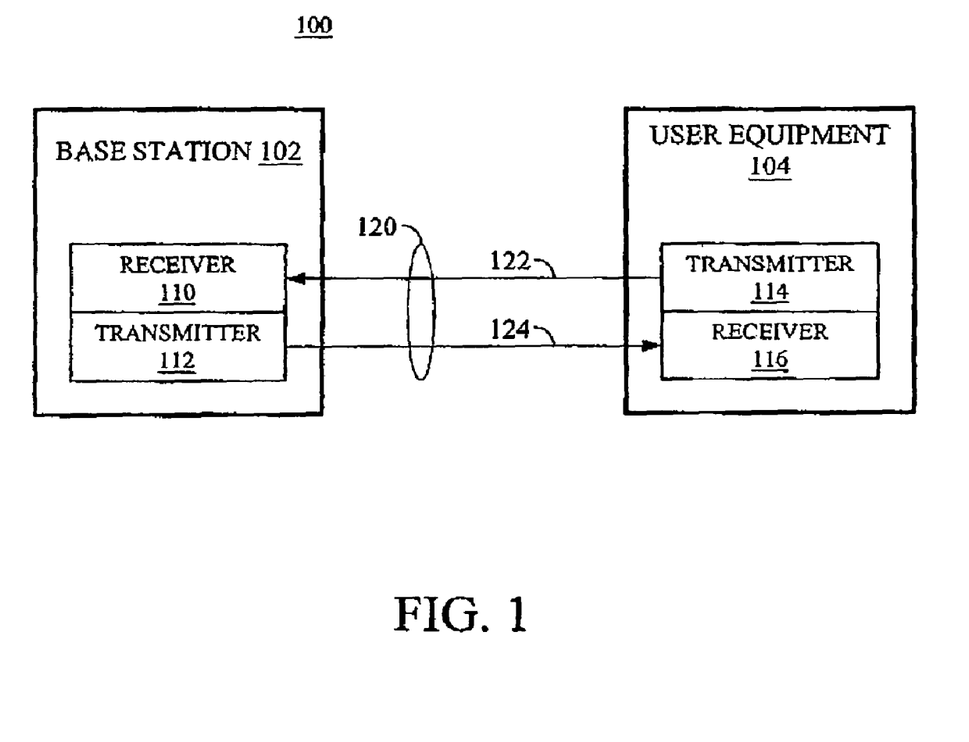
FIG. 1 depicts a wireless communications environment, wherein user equipment communicates with a base station via a wireless link.

FIG. 1 depicts a wireless communications environment 100 within which the present invention operates. As shown, user equipment (UE) 104 communicates with a base station 102 via a wireless link 120. Wireless link 120 includes an uplink 122 and a downlink 124. A transmitter 112 in base station 102 transmits data organized as radio frames over downlink 124 that are received by a receiver 116 in UE 104. Similarly, a transmitter 114 in UE 104 transmits radio frames over uplink 122 that are received by a receiver 110 in base station 102. As will be apparent to those skilled in the art, the transmitter/receiver pairs in base station 102 and UE 104 can be implemented, for example, as separate functional units (as depicted in FIG. 1) or as a single transceiver unit.

According to an example embodiment of the present invention, transmitters 112 and 114 comply with the requirements set forth in 3GPP UTRAN FDD transmitter specifications, such as 3GPP TS 25.212 V3.5.0 (200-12) entitled "3$^{rd}$ Generation Partnership Project; Technical Specification Group Radio Access Network; Multiplexing and channel coding (FDD)" (Release 1999), the entirety of which is incorporated herein by reference. This specification is referred to herein as the 25.212 specification. The operation of uplink transmitter 114 according to the 25.212 specification is summarized in the following sections. This is followed by a description of uplink transmitter 114 having an improved first de-interleaver according to various example embodiments of the present invention. Though the principles of the present invention are described in the context of uplink 122 for illustrative purposes, it will be apparent to those skilled in the art that these principles can also be applied to downlink transmitter 112.

3GPP Uplink Transmitter

Figure 2:
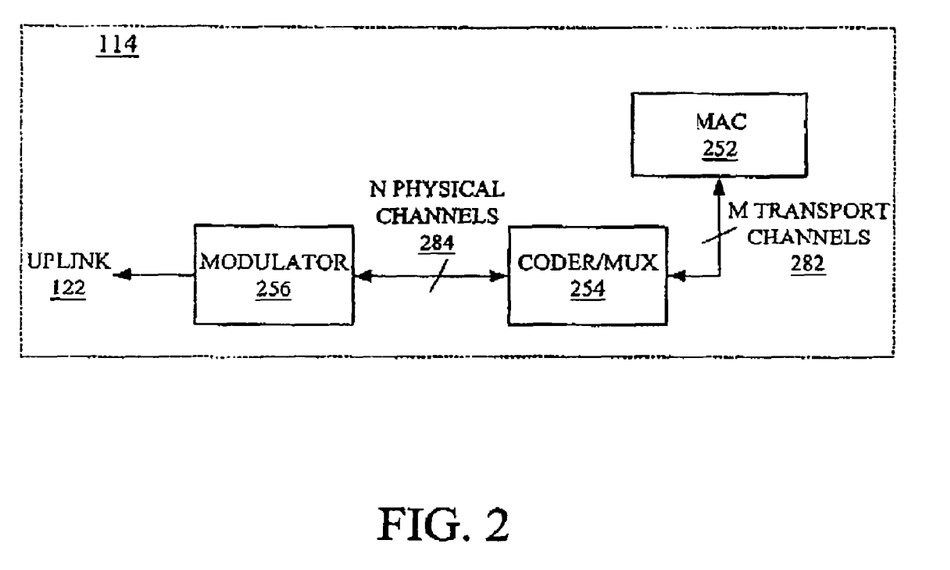
FIG. 2 depicts a 3GPP uplink transmitter in greater detail.

FIG. 2 depicts uplink transmitter 114 in greater detail. As shown, uplink transmitter 114 includes a medium access control (MAC) layer 252, a coding/multiplexing unit 254, and a modulator 256. The specifications of these components are described in detail in various 3GPP UTRAN FDD specifications. Coding/multiplexing unit 254 exchanges data with MAC 252 in the form of transport block sets from one or more transport channels 282 (the number of transport channels is given by M). Coding/multiplexing unit 254 processes and multiplexes together these transport blocks into radio frame data over one or more physical channels 284 (the number of physical channels is given by N). For example, the current 3GPP UTRAN FDD transmitter implementation allows up to eight physical channels in downlink 124 and six physical channels in uplink 122. However, it will be apparent that the principles described herein are extensible to any number of physical channels. Modulator 256 modulates the radio frame data from physical channels 284 for transmission over uplink 122.

Figure 3:
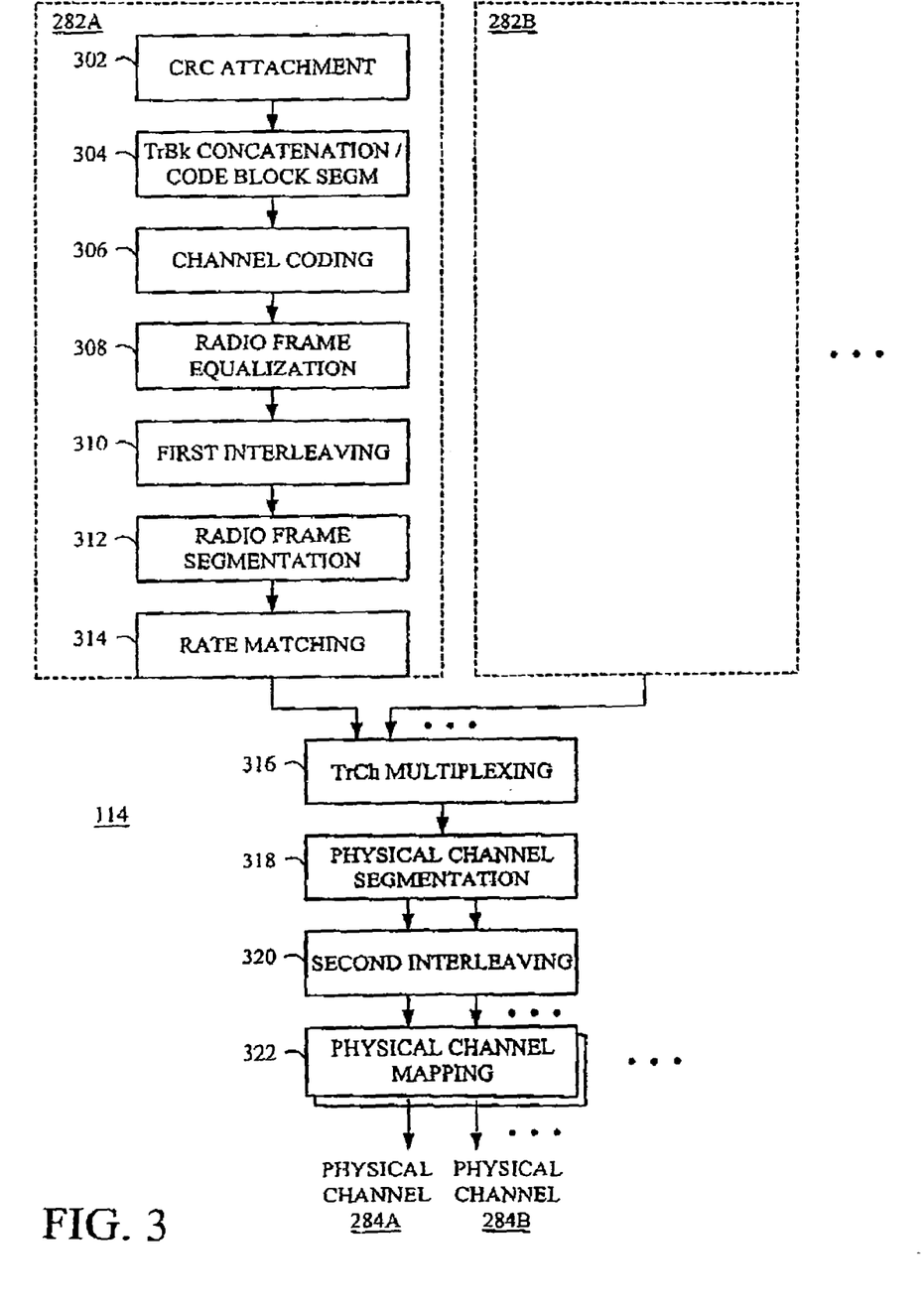
FIG. 3 depicts the operation of a 3GPP coding/multiplexing unit within the uplink transmitter in greater detail.

FIG. 3 depicts the operation of coding/multiplexing unit 254 in greater detail according to the 25.212 specification. In operation 302, error detection is provided by adding a Cyclic Redundancy Check (CRC) to the transport blocks. The size of the CRC for each transport channel 282 is signaled from higher software layers (not shown). In operation 304, transport block concatenation and code block segmentation are performed. All transport blocks in a transport time interval (TTI) are serially concatenated, and then segmented into code blocks. If the number of bits in a TTI is larger than the maximum size of a code block in question, then code block segmentation is performed after the concatenation of the transport blocks. The maximum size of the code blocks depends on whether convolutional coding, turbo coding or no coding is used for the transport channel. In operation 306, one of these three coding schemes is applied to the data in each transport channel 282. In operation 308, radio frame size equalization is performed. In this operation, the input bit sequence is padded in order to ensure that the output can be segmented in data segments of equal size.

In operation 310, a first interleaving is performed wherein data is interleaved into different radio frames. As described in the 25.212 specification, a block interleaver with inter-column permutations is used to perform this operation. The first interleaving operations is described in greater detail below.

In operation 312, when the TTI is longer than 10 ms, the input bit sequence is segmented and mapped onto consecutive radio frames. In operation 314, rate matching is performed wherein bits on each transport channel 282 are repeated or punctured. Higher layers assign a rate-matching attribute for each transport channel 282. The rate-matching attribute is used when the number of bits to be repeated or punctured is calculated. The number of bits on a transport channel can vary between different TTIs. When the number of bits between different TTIs in uplink 122 is changed, bits are repeated or punctured to ensure that the total bit rate after transport channel multiplexing is identical to the total channel bit rate of the allocated dedicated physical channels. As shown in FIG. 3, operations 302 through 314 are performed for each transport channel 282.

In operation 316, radio frames are received from each transport channel 282 every 10 ms and are then serially multiplexed into a coded composite transport channel. In operation 318, physical channel segmentation divides each radio frame into physical channel frames, one such frame for each physical channel 284 (when more than one physical channel is used).

In operation 320, the second interleaving operation is performed, wherein the data inside each radio frame is interleaved. According to the block interleaver described in the 25.212 specification, bits are padded and input to a matrix having an inter-column permutation. Bits are then output from the matrix with pruning. In operation 322, the physical channel frames of interleaved data are mapped to physical channels 284 and sent to modulator 256 for transmission.

Downlink transmitter 112 operates in a similar fashion to uplink transmitter 114. The 25.212 specification describes the operation of the uplink and downlink transmitters in detail. Specifically, both transmitters include a first interleaving operation 310. As a result, memory savings can be realized in both the uplink and downlink transmitters by applying the techniques of the present invention described herein.

The following section describes first interleaving operation 310 in greater detail according to the 25.212 specification. Later sections describe various example embodiments according to the present invention having modified first interleavers that require less memory than conventional designs.

First Interleaving Operation

Figure 4A:
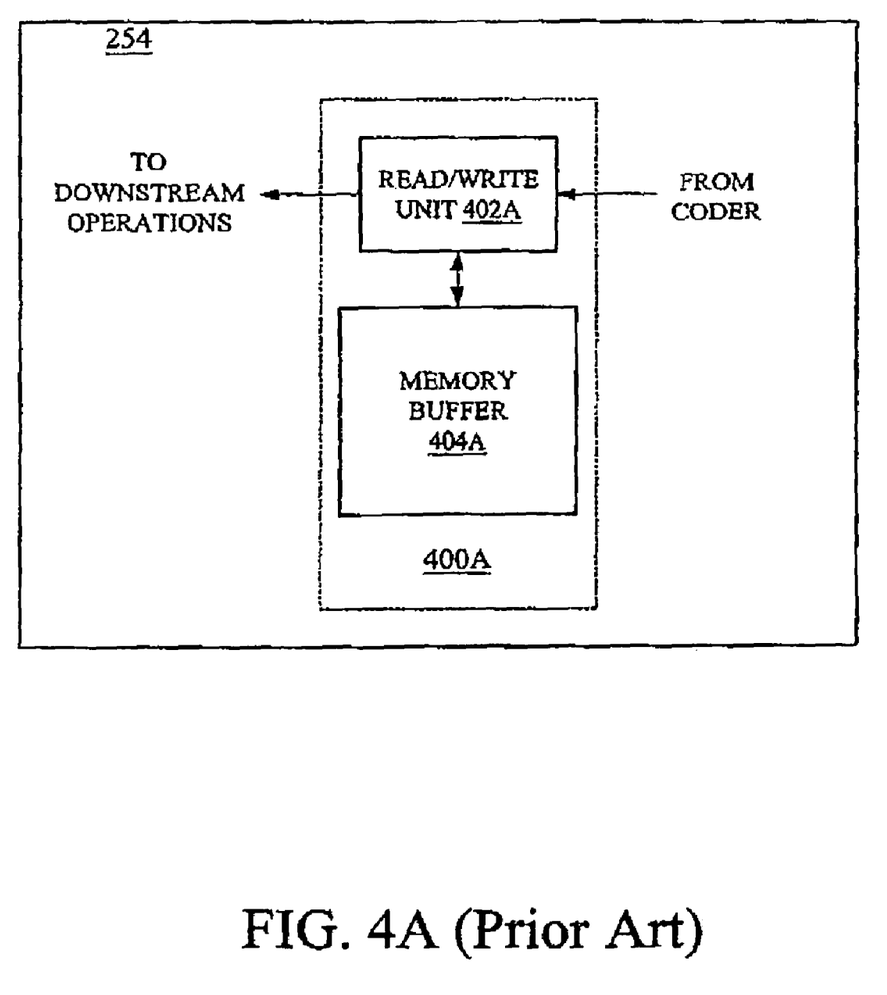
FIG. 4A depicts a conventional first interleaver within the coding/multiplexing unit.

FIG. 4A depicts an example first interleaver 400A within coding/multiplexing unit 254 that operations according to a conventional design. As shown, first interleaver 400A includes a read/write unit 402A and a memory buffer 404A. Memory buffer 404A represents available random access memory (RAM) implemented as one or more memory devices. Read/write unit 402A represents hardware, software, or a combination of hardware and software that is configured to write to and read from memory buffer 404A in the manner described herein. For example, the operations described below can be performed in hardware under the control of parameters stored in registers, where the parameters are set up by software.

Read/write unit 402A receives an input bit stream of padded code blocks output from channel coding operation 306 and radio frame equalization 308. Read/write unit 402A writes this input data stream to memory buffer 404A according to a specified pattern. Read/write unit 402A reads data out of memory buffer 404A, also according to a specified pattern, creating an output bit stream that is passed on to downstream operations such as radio frame segmentation 312, rate matching 314, and transport channel multiplexing 316.

Figure 5:
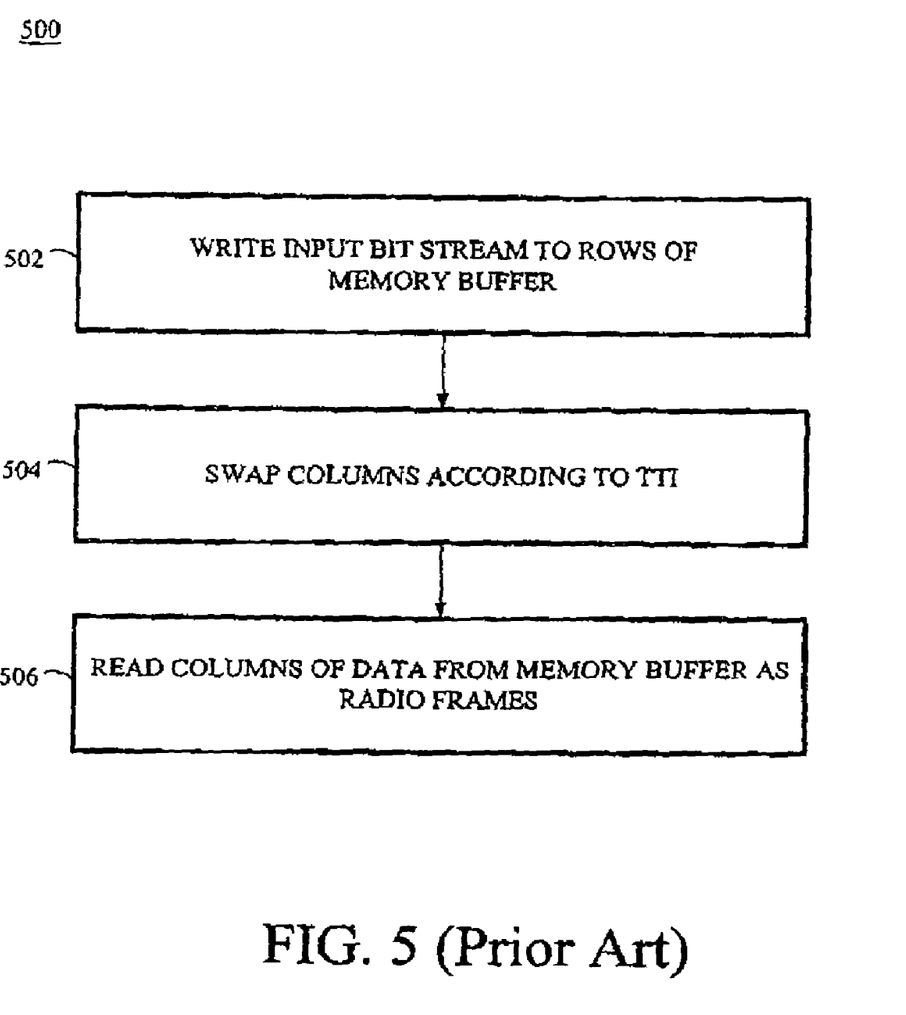
FIG. 5 is a flowchart that describes the operations of a first interleaver according to a conventional design.

FIG. 5 is a flowchart 500 that describes the operations of first interleaver 400A according to the 25.212 specification. In operation 502, the input data stream is written to memory buffer 404A, wherein the data is configured as a matrix having R rows and C columns. The number of columns C is determined by the TTI, according to the following table:

| TTI | Number of columns C | Shuffle pattern: (Columns numbered 1 to C) |
|---|---|---|
| 10 ms | 1 | No shuffle |
| 20 ms | 2 | No shuffle |
| 40 ms | 4 | Swap column 2 and 3 |
| 80 ms | 8 | Swap column 2 and 5, 4 and 7 |

Figure 6A:
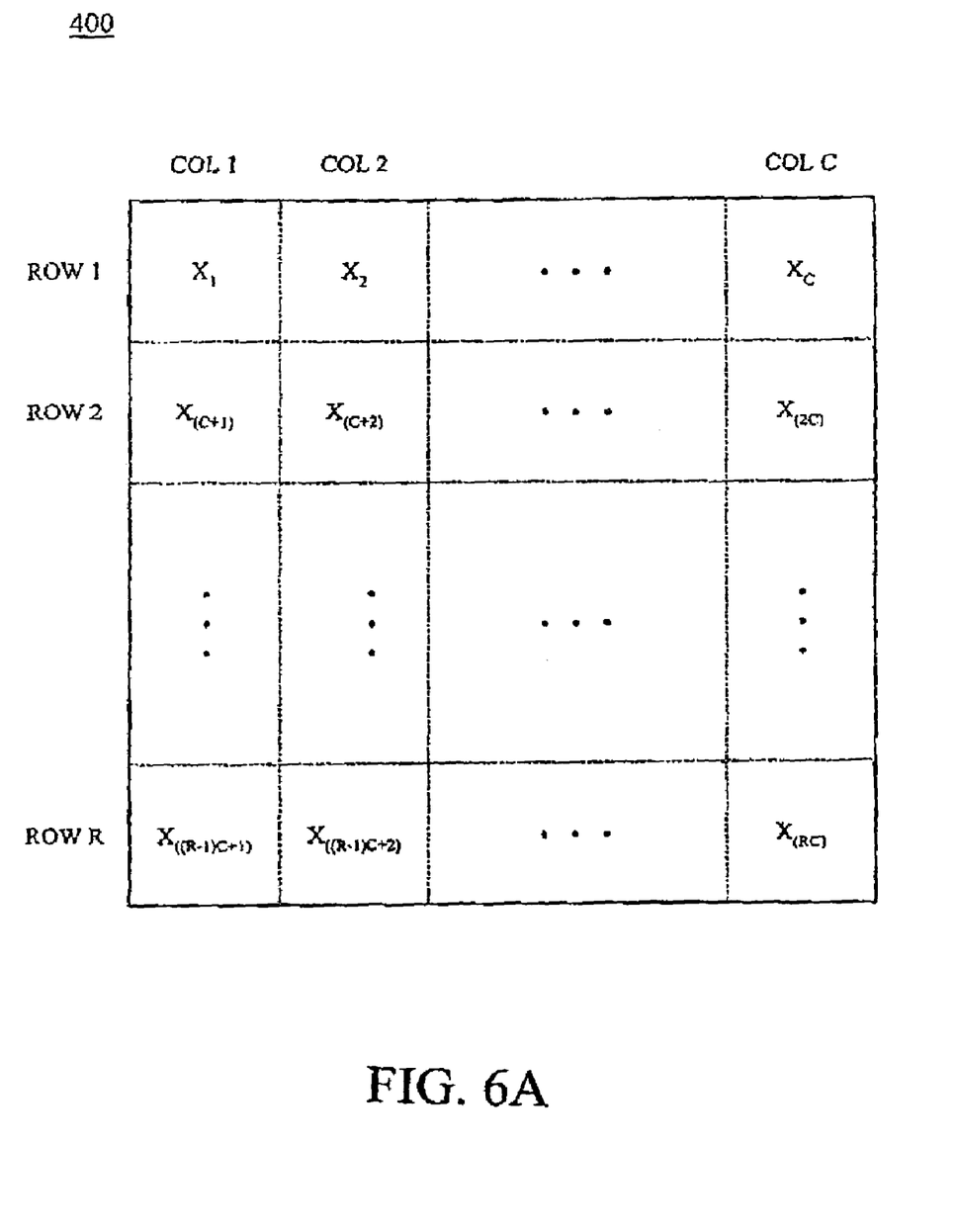
FIG. 6A depicts an example input data stream stored in a memory buffer after the input data stream has been written to the rows of the memory buffer.

The input data stream is written to memory buffer 404A by rows. FIG. 6A depicts an example input data stream stored in memory buffer 404A at the completion of operation 502. The input data stream is shown as x, where $x_n$ is the $n^{th}$ bit in the input data stream. As will be apparent, the matrix configuration represents a logical arrangement of data, not necessarily a physical arrangement.

In operation 504, the matrix columns may be shuffled as described in the 25.212 specification, where the shuffle pattern is determined by the TTI as shown in the preceding table. For example, columns 2 and 3 in FIG. 6A are swapped for a code block having a TTI=40 ms.

Figure 6B:
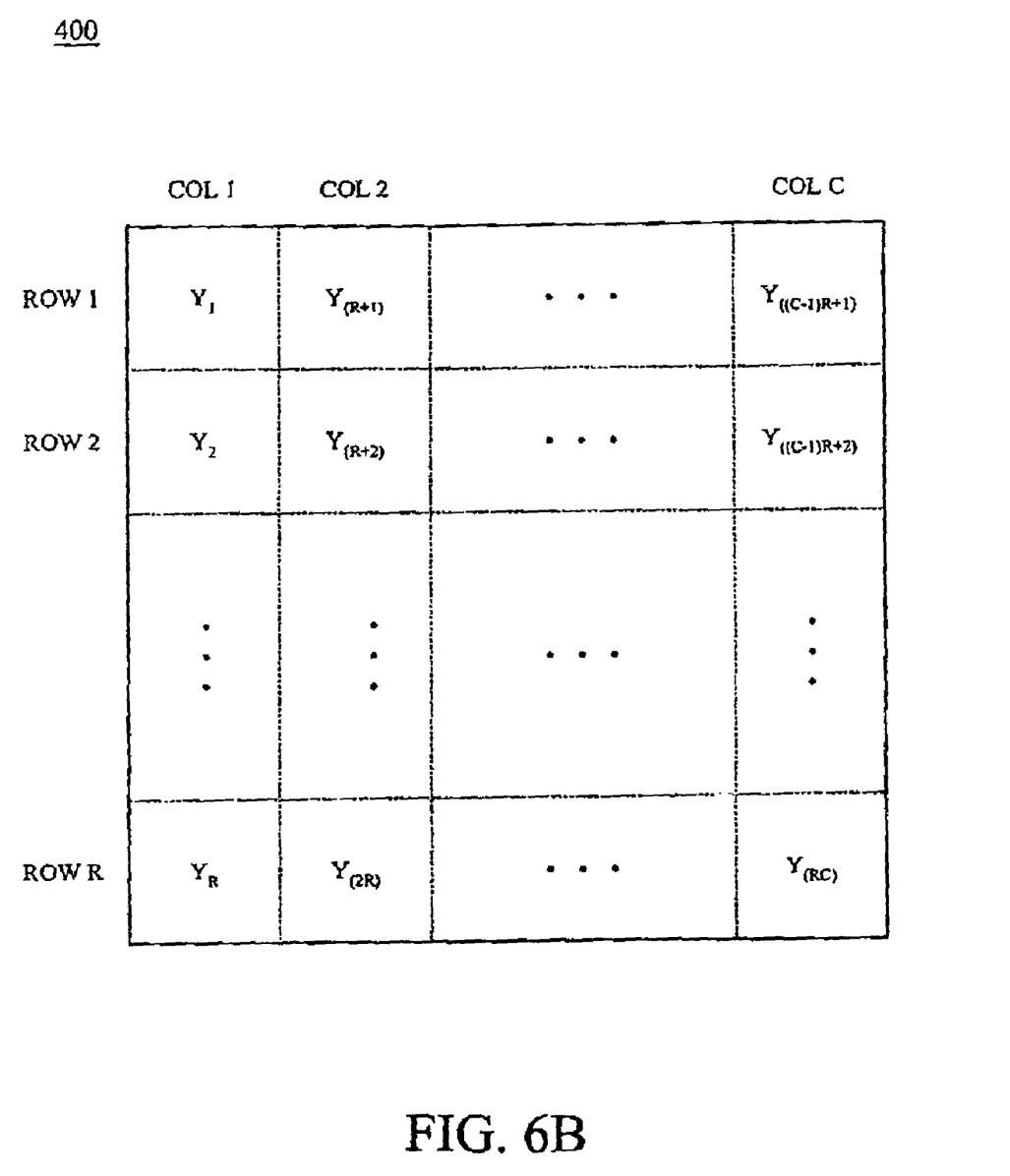
FIG. 6B depicts the data stored within the memory buffer according to the order in which the data is read out after a first interleaving as an output data stream.

In operation 506, data is read from memory buffer 404A in columns, forming an output data stream. FIG. 6B depicts the output data stream according to the order in which the data is read out, where $y_n$ is the $n^{th}$ bit of the output bit stream. The first column of this shuffled matrix will be transmitted in the first radio frame of the TTI, the next column in the next radio frame of the TTI, and so on until the columns are exhausted (note that for TTI=10 ms there is only one column and therefore only one radio frame). For example, the first radio frame of the TTI will include bits $y_1$ through $y_R$, the second radio frame will include bits $y_{(R+1)}$ through $y_{(2R)}$, and so on, with the final radio frame including bits $y_{((C-1)R+1))}$ through $y_{(RC)}$.

The operations depicted in FIG. 5 describe the operation of a conventional block interleaver well known in the art. As will be apparent, other variations of block interleavers fall within the scope of the present invention.

Sending First Radio Frame Downstream

Figure 4B:
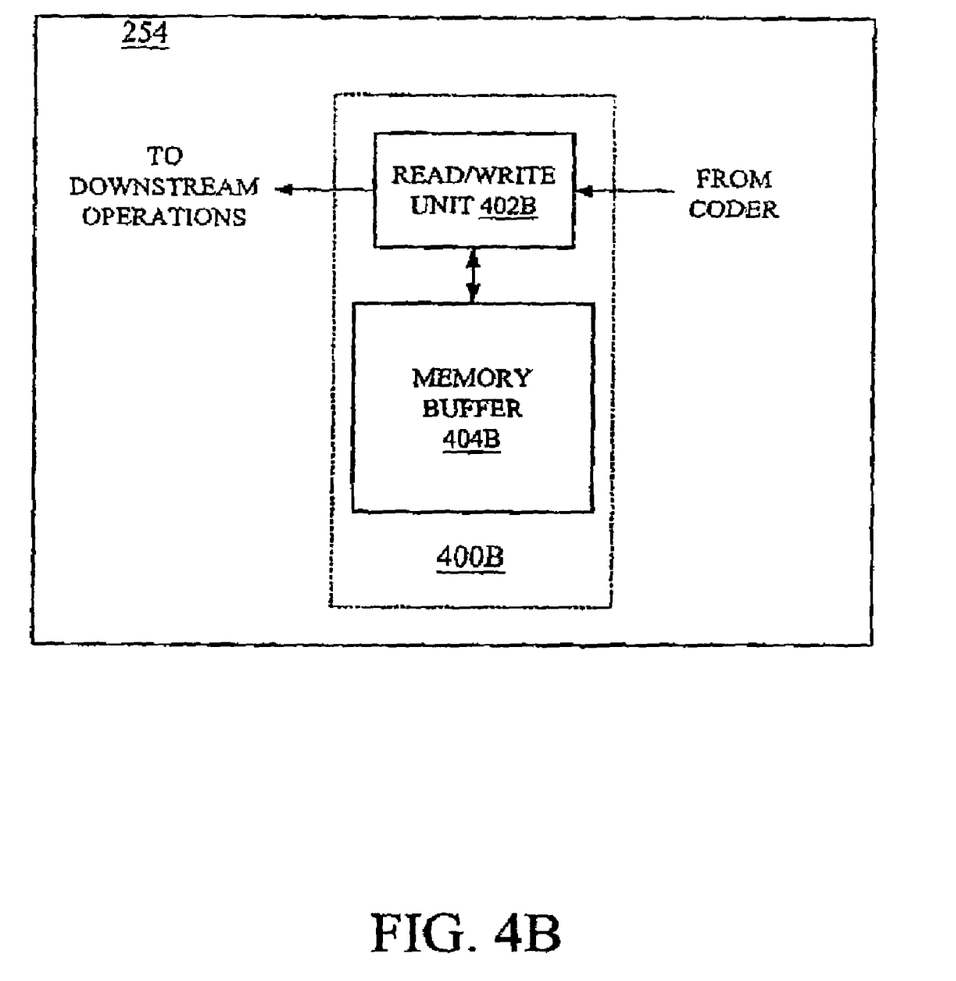
FIG. 4B depicts a first interleaver according to an example embodiment of the present invention.

FIG. 4B depicts an example first interleaver 400B within coding/multiplexing unit 254 that operations according to example embodiments of the present invention. As shown, first interleaver 400B includes a read/write unit 402B and a memory buffer 404B. Memory buffer 404B represents available RAM implemented as one or more memory devices. Read/write unit 402B represents hardware, software, or a combination of hardware and software that is configured to write to and read from memory buffer 404B in the manner described below. As compared to first interleaver 400A, the operation of read/write unit 402B according to various example embodiments of the present invention can allow for memory buffer 404B to be implemented using less memory than the conventional design of memory buffer 404A.

Figure 7:
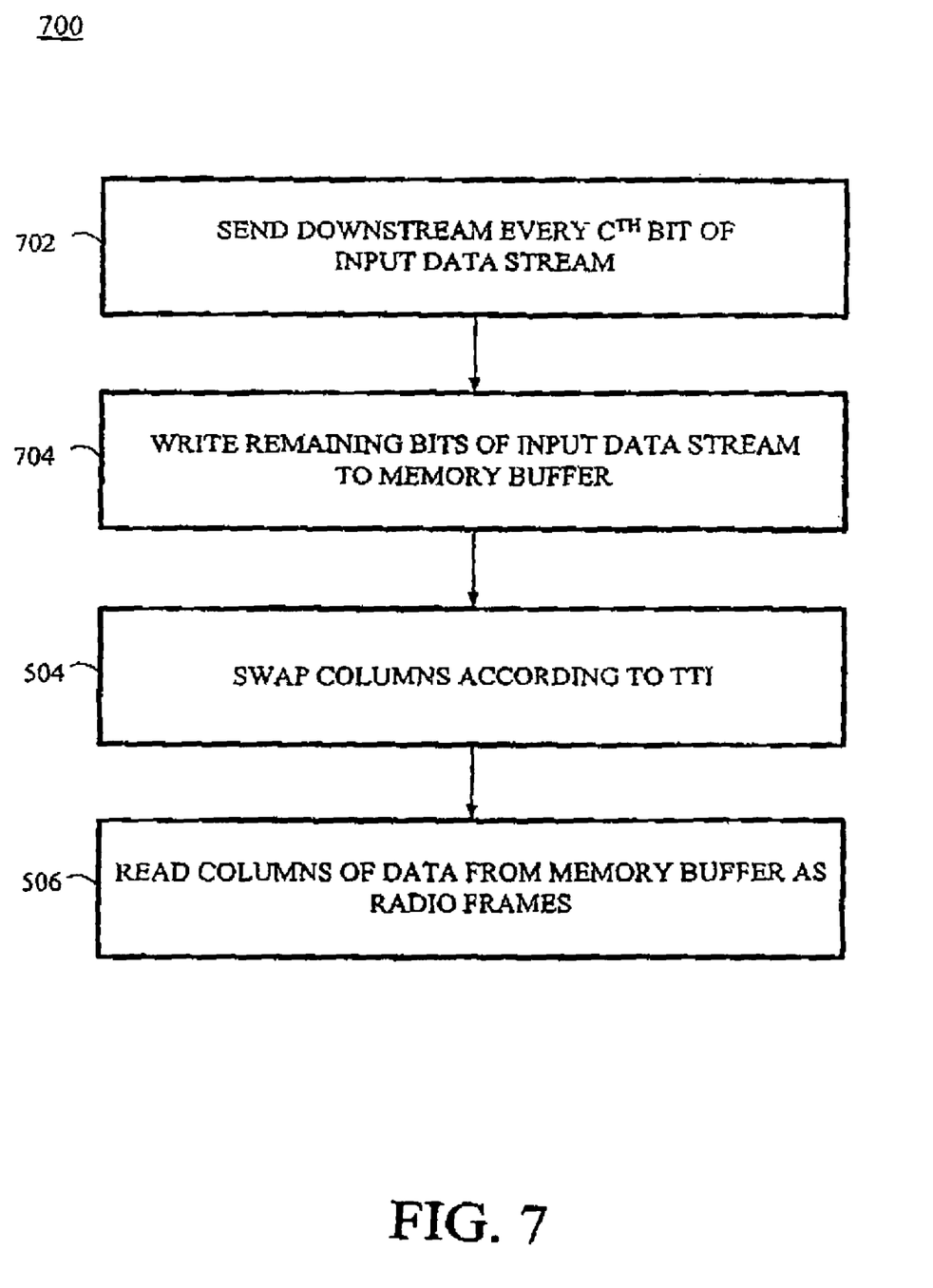
FIG. 7 is a flowchart that describes the operation of a first interleaver according to a first example embodiment of the present invention.

FIG. 7 is a flowchart 700 that describes the operation of first interleaver 400B according to a first example embodiment of the present invention. In operation 702, every $C^{th}$ bit of the input data stream is sent downstream. For example, read/write unit 402B sends every $C^{th}$ bit to radio frame segmentation 312. Sending input bits downstream obviates the need to store these bits in memory buffer 404B. Memory buffer 404B can therefore be reduced in size (compared to memory buffer 404A) because less data needs to be stored.

Bits are selected from the input data stream so that the first column of the output data matrix (shown in FIG. 6B as $y_1$ to $y_R$) is sent downstream for each input block of data. As described above, C represents the number of columns in the input data matrix stored in memory buffer 404B. Selecting every $C^{th}$ bit, beginning with the first bit in the input data stream ($x_1$), results in the first column being sent downstream.

In operation 704, the remaining bits in the input data stream are written to memory buffer 404B, corresponding to columns 2 through C in the output data matrix as shown in FIG. 6B. Operations 504 and 506 are then performed as described above, with the remaining columns 2 through C being swapped (if necessary) and read out of memory buffer 404B as radio frames once the radio frame segmentation operation 312 has been completed for the radio frame corresponding to column 1. Comparing FIGS. 5 and 7, operations 702 and 704 according to an example embodiment of the present invention replace operation 502 in FIG. 5.

Consider an example code block wherein the TTI=10 ms. Referring to the preceding table, the input data matrix has a single column (C=1). As a result, in operation 502 the input data is sent downstream to radio frame segmentation 312 with no requirement that the input data be stored in memory buffer 404B. According to this example embodiment of the present invention, memory buffer 404B is not required for code blocks having a TTI=10 ms.

For TTI=20 ms (C=2), every second bit ($x_1, x_3, x_5, \ldots, x_{((R-1)2+1))}$ is sent downstream to radio frame segmentation 312. These bits correspond to the first column of the output data matrix ($y_1, y_2, y_3, \ldots, y_R$). The remaining bits ($x_2, x_4, x_6, \ldots$) are stored as column 2. Column 2 is then read from memory buffer 404B in operation 506 for processing once radio frame segmentation 312 has been completed with respect to the column 1 data. According to this example embodiment of the present invention, the size of memory buffer 404B can be reduced by half because only half of the input data stream is stored in memory buffer 404B.

For TTI=40 ms (C=4), every fourth bit ($x_1, x_5, x_9, \ldots, x_{((R-1)4+1))}$ is sent downstream in operation 702 to radio frame segmentation 312. Again, these bits correspond to the first column of the output data matrix ($y_1, y_2, y_3, \ldots, y_R$). In operation 704, the remaining bits ($x_2, x_3, x_4, x_6, x_7, x_8, \ldots$) are stored as columns 2 ($x_2, x_6, x_{10}, \ldots$), 3 ($x_3, x_7, x_{11}, \ldots$), and 4 ($x_4, x_8, x_{12}, \ldots$). Columns 2 and 3 are swapped in operation 504. The columns of the output data matrix are then read out in operation 506 as needed by radio frame segmentation operation 312. According to this example embodiment of the present invention, the size of memory buffer 404B can be reduced by one-fourth.

For TTI=80 ms (C=8), every eighth bit ($x_1, x_9, x_{17}, \ldots, x_{((R-1)8+1))}$ corresponding to the first column of the output data matrix is sent downstream in operation 702 to radio frame segmentation 312. In operation 704, the remaining bits are stored as columns 2 through 8. Columns 2 and 5, and columns 4 and 7 are swapped in operation 504. The columns of the output data matrix are then read out in operation 506 as needed by radio frame segmentation operation 312. According to this example embodiment of the present invention, the size of memory buffer 404B can be reduced by one-eighth.

Discarding/Re-Calculating Bits

Figure 8:
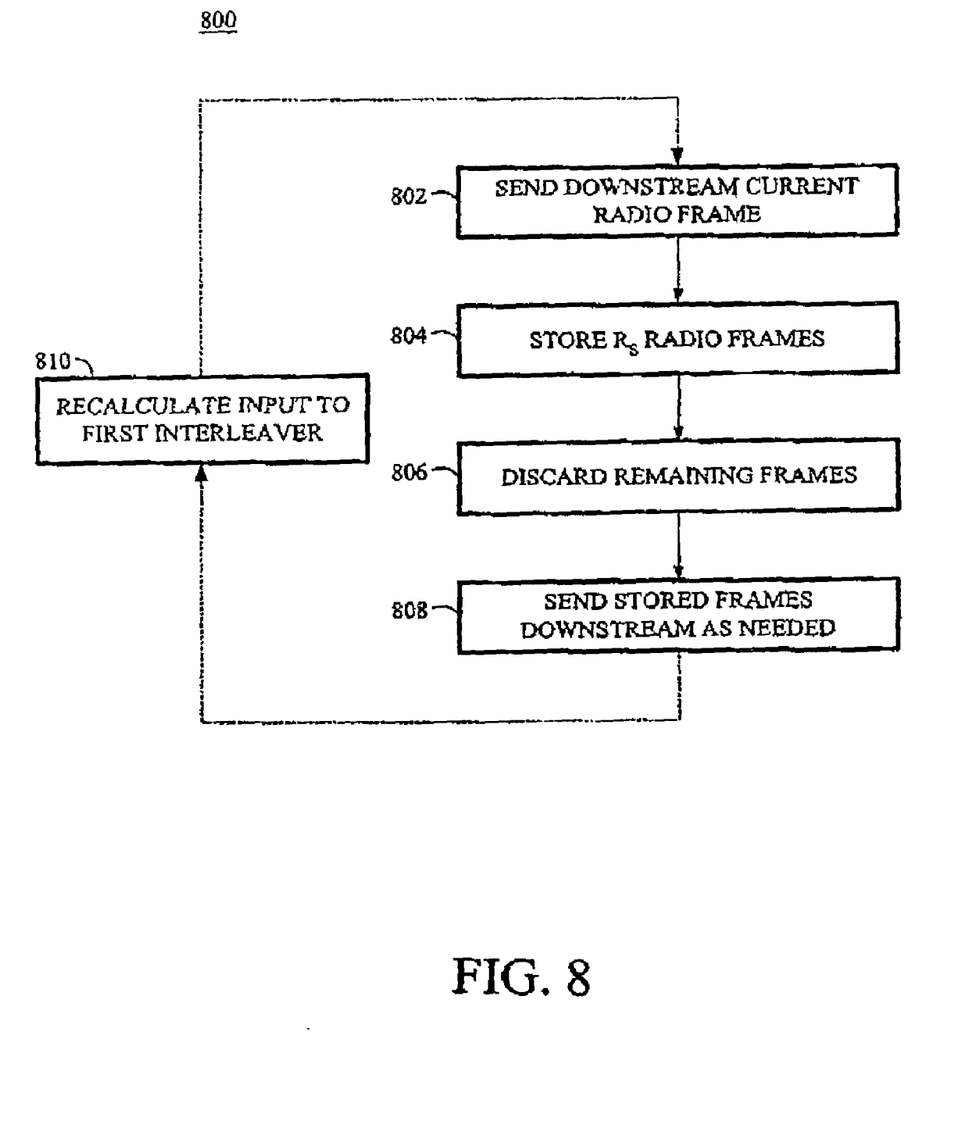
FIG. 8 is a flowchart that describes the operation of a first interleaver according to a second example embodiment of the present invention.

FIG. 8 is a flowchart 800 that describes the operation of first interleaver 400B according to a second example embodiment of the present invention. In this embodiment, bits not currently needed for processing are discarded and then recalculated at a later time. Less memory is therefore required because fewer bits are stored at any given time. Subsequent recalculations send downstream and store different portions of the input data stream. These recalculations are repeated for different portions of a particular input code block until the block has been interleaved and passed on to radio frame segmentation 312.

As shown in the following table, the number of frames (given by $R_s$) that are stored in buffer memory 404B and the TTI of the input code block determine the savings in memory as well as the number of times the input code block is recalculated:

| Frames Stored ($R_s$) | TTI (ms) | Percent Reduction in Size of Memory Buffer | Number of Recalculations |
|---|---|---|---|
| 0 | 10 | 100% (no memory needed) | 0 |
| 0 | 20 | 100 | 1 |
| 0 | 40 | 100 | 3 |
| 0 | 80 | 100 | 7 |
| 1 | 20 | 50 | 0 |
| 1 | 40 | 75 | 1 |
| 1 | 80 | 87.5 | 3 |
| 3 | 40 | 25 | 0 |
| 3 | 80 | 62.5 | 1 |
| 7 | 80 | 12.5 | 0 |

For example, for input code blocks having a TTI of 40 ms, storing zero radio frames obviates the need for any storage in memory buffer 404B, but will require that the input data be recalculated 3 times. The table expresses memory savings in terms of a reduction in the size of memory buffer 404B as a percentage of the size that would be required to store the entire input block. In the preceding example, storing zero radio frames reduces the memory required by 100% since the need for storage in memory buffer 404B is obviated. As a second example, for input blocks having a TTI of 80 ms, storing 3 radio frames reduces the size of memory buffer 404B by 62.5% since memory buffer 404B must accommodate 8 radio frames to store the entire input block. In this second example, the input data is recalculated once.

The operations depicted in FIG. 8 are repeated for each recalculation of the input data. These operations are now described in greater detail. In operation 802, a radio frame of data from the current input code block is sent downstream to radio frame segmentation operation 312. With each iteration of operation 802, the radio frame currently expected by radio frame segmentation operation 312 is sent downstream. This is accomplished as described above by sending downstream every $C^{th}$ bit of the input data, where the first bit is selected so that the column corresponding to the next radio frame is sent downstream. In operation 804, the columns from the output data matrix corresponding to the next $R_s$ radio frames are stored in memory buffer 404B. In operation 806, those radio frames that are not stored in operation 804 are discarded. In operation 808, the $R_s$ radio frames stored in memory buffer 404B are read out to radio frame segmentation 312 in the proper order.

Operations 802 through 808 are repeated for each recalculation of the input data. As shown in the preceding table, the number of recalculations is determined by the TTI and the storage capacity of memory buffer 404B. With each iteration, the current input block is recalculated in operation 810. The input block can be recalculated, for example, by repeating the processing upstream from first interleaving operation 310 (e.g., operations 302 to 308). Operations 802 through 808 are then performed for the next $R_s$+1 radio frames. The following examples will further illustrate the operations depicted in FIG. 8.

Consider an input code block having a TTI of 20 ms (C=2) where no data is stored in memory buffer 404B ($R_s$=0). In operation 802, a radio frame of data corresponding to the first column of the output data matrix is sent downstream. This is accomplished by sending downstream every other bit of the input data, beginning with the first bit. The remaining bits from the input data stream are discarded in operation 806, and as a result, nothing is stored in operation 804 or read out in operation 808. When it is time for the first interleaver to output the next radio frame of data (i.e., the bits that where discarded), the input code block is recalculated in operation 810 by repeating the operations in the transmitter chain upstream from first interleaving operation 310. On the second iteration of operations 802 through 808, the next radio frame of data (corresponding to the second column of the output data matrix) is sent downstream by sending every other bit of the input data stream beginning with the second bit and discarding those bits associated with the first radio frame. According to this example embodiment of the present invention, a savings in memory is therefore achieved at the expense of doing one recalculation of the input data.

Consider an input code block having a TTI of 40 ms (C=4) where one radio frame of data is stored in memory buffer 404B ($R_s$=1). In operation 802, a radio frame of data corresponding to the first column of the output data matrix is sent downstream. This is accomplished by sending downstream every fourth bit of the input data, beginning with the first bit. In operation 804, the radio frame of data corresponding to the second column of the output data matrix (bits $x_3$, $x_7$, $x_{11}$, $x_{15}$, . . . from the input data stream) is stored in memory buffer 404B. In operation 806, the remaining radio frames corresponding to the third and fourth columns of the output data matrix are discarded. In operation 808, when it is time for the first interleaving operation to output data for the second radio frame in the TTI, the data is read from memory buffer 404B to radio frame segmentation 312.

At this point, the first two of four radio frames from the input code block have been processed by the first interleaving operation according to this example embodiment of the present invention. As shown in the table above, once recalculation of the input data is performed for a TTI of 40 ms and one frame stored. In operation 810, the input code block is recalculated and operations 802 through 808 are repeated for the third and fourth radio frames. In operation 802, the radio frame corresponding to the third column of the output data matrix (bits $x_2$, $x_6$, $x_{10}$, $x_{14}$ . . . from the input data stream) is sent downstream, and the radio frame corresponding to the fourth column of the output data matrix (bits $x_4$, $x_8$, $x_{12}$, $x_{16}$, . . . from the input data stream) is stored in memory buffer 404B in operation 804. In operation 806, the first two radio frames are discarded. The fourth radio frame is then read from memory 404B in operation 808 at the appropriate time for downstream processing. According to this example embodiment of the present invention, the size of memory buffer 404B is reduced by 75% because now one frame of data is stored rather than all four of the frames associated with the input code block. This reduction in memory is gained at the expense of performing one recalculation of the input code block.

These examples illustrate the general principles according to this example embodiment of the present invention that memory savings can be traded for increased processing. Storing no radio frames has the greatest advantage in terms of gate-count and memory required, as this not only eliminates the need for memory buffer 404B but also saves the associated address decoding and pointers in read/write unit 402B. Storing no radio frames can however require up to seven recalculations (for an 80 ms TTI input block).

Although the present invention has been described with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, though example embodiments of the present invention have been described in the context of uplink 122, it will be apparent to those skilled in the art that the same principles can be applied to transmitter 112 to achieve similar results for downlink 124.

CONCLUSION

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. A system for interleaving data in a wireless device, comprising:
   a memory buffer; and
   means, coupled to said memory buffer, for sending downstream for processing, a portion of an input data stream comprising every $C^{th}$ bit of said input data stream and for writing a remaining portion of bits of said input data stream to said memory buffer, wherein said writing to said memory buffer is performed based on a first interleaving pattern, and wherein C is an integer indicating a number of columns in said memory buffer.

2. The system of claim 1, wherein said portion of an input data stream comprising every $C^{th}$ bit is sent downstream for processing without being stored in said memory buffer.

3. The system of claim 1, wherein said means comprises means for reading said remaining portion of bits of said input data stream from said memory buffer, forming an output data stream.

4. A system for interleaving data in a wireless device, comprising:
   a memory buffer;
   means for sending downstream for processing, a portion of an input data stream comprising every $C^{th}$ bit of said input data stream, wherein C is an integer indicating a number of columns in said memory buffer;
   means for writing a remaining portion of bits of said input data stream to said memory buffer; and
   means for reading said remaining portion of said bits of said input data stream from said memory buffer, wherein said reading from said memory buffer is performed based on a first interleaving pattern.

5. A transmitter that transmits data via a wireless link, the transmitter comprising:
   a medium access control layer;
   a coding/multiplexing unit, comprising:
      a memory buffer, and
      means, coupled to said memory buffer, for sending downstream for processing, a portion of an input data stream comprising every $C^{th}$ bit of said input data stream from said medium access control layer and for writing a remaining portion of bits of said input data stream to said memory buffer, wherein said writing to said memory buffer is performed based on first interleaving pattern, and wherein C comprises is an integer indicating a number of columns in said memory buffer; and
   a modulator coupled between the wireless link and said coding/multiplexing unit.

6. A system for interleaving data in a wireless device, comprising:
   a memory buffer; and
   a read/write unit, coupled to said memory buffer, wherein said read/write unit is configured to send downstream for processing, a portion of an input data stream comprising every $C^{th}$ bit of said input data stream and to write a remaining portion of bits of said input data stream to said memory buffer, wherein said writing to said memory buffer is performed based on a first interleaving pattern, and wherein C is an integer indicating a number of columns in said memory buffer.

7. A system for interleaving data in a wireless device, comprising:
   a memory buffer; and
   means for sending downstream a first radio frame from a first portion of an input code block, for storing one or more additional radio frames from a second portion of said input code block in said memory buffer and discarding radio frames from a remaining portion of said input code block, for sending said one or more additional radio frames downstream from said memory buffer, and for causing said input code block to be recalculated.

8. A method for interleaving data in a wireless device, comprising:
   sending downstream for processing a portion of an input data stream comprising every $C^{th}$ bit of said input data stream; and writing a remaining portion of bits of said input data stream to a memory buffer, wherein said writing to said memory buffer is performed based on a first interleaving pattern, and wherein C is an integer indicating a number of columns in said memory buffer.

9. The method of claim 8, wherein said portion of said input data stream comprising every $C^{th}$ bit is sent downstream without being stored in said memory buffer.

10. The method of claim 8, comprising reading said remaining portion of said bits of said input data stream from said memory buffer to form an output data stream.

11. A method for interleaving data in a wireless device, comprising:
   sending downstream for processing, a portion of an input data stream comprising every $C^{th}$ bit of said input data stream, without storing said $C^{th}$ bit of said input data stream in a memory buffer, wherein C is an integer indicating a number of columns in said memory buffer;
   writing a remaining portion of bits of said input data stream to said memory buffer; and
   reading said remaining portion of bits of said input data stream from said memory buffer, wherein said reading from said memory buffer is performed based on a first interleaving pattern.

12. A method for interleaving data in a wireless device, comprising:
   (a) sending downstream a first radio frame from a first portion of an input code block;
   (b) storing one or more additional radio frames from a second portion of said input code block in a memory buffer and discarding any radio frames in a remaining portion of said input code block;
   (c) reading said one or more additional radio frames from said memory buffer and sending said one or more additional radio frames downstream; and
   (d) recalculating said input code block and repeating operations (a) through (d) until said radio frames in said remaining portion of said input code block have been sent downstream.

13. A system for interleaving data in a wireless device, comprising:
   a memory buffer; and
   at least one processor that enables sending downstream a first radio frame from a first portion of an input code block, said at least one processor enables storing of one or more additional radio frames from a second portion of said input code block in said memory buffer and discarding radio frames from a remaining portion of said input code block, said at least one processor enables sending of said one or more additional radio frames downstream from said memory buffer, and said at least one processor enables recalculation of said input code block.

14. The system according to claim 13, wherein said at least one processor enables frame segmentation of said first radio frame from said first portion of said input code block.

15. The system according to claim 13, wherein said at least one processor enables swapping of one or more columns of said stored one or more additional radio frames from said second portion of said input code block, within said memory buffer.

16. The system according to claim 15, wherein said swapping of said one or more columns is performed based on at least one interleaving pattern.

* * * * *